(12) United States Patent
Zeleny et al.

(10) Patent No.: US 11,920,960 B2
(45) Date of Patent: Mar. 5, 2024

(54) CAPACITIVE MEASURING SYSTEM

(71) Applicant: KOSTAL Automobil Elektrik GmbH & Co. KG, Luedenscheid (DE)

(72) Inventors: Torben Zeleny, Wuppertal (DE); Uwe Borgmann, Recklinghausen (DE); Jan Freiwald, Dortmund (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 884 days.

(21) Appl. No.: 16/983,330

(22) Filed: Aug. 3, 2020

(65) Prior Publication Data

US 2020/0361408 A1 Nov. 19, 2020

Related U.S. Application Data

(63) Continuation of application No. PCT/EP2019/052525, filed on Feb. 1, 2019.

(51) Int. Cl.
   *G01D 5/24* (2006.01)
   *B60R 21/015* (2006.01)
   *G01R 27/26* (2006.01)

(52) U.S. Cl.
   CPC ......... *G01D 5/24* (2013.01); *B60R 21/01532* (2014.10); *G01R 27/2605* (2013.01)

(58) Field of Classification Search
   CPC . B60R 21/01532; G01D 5/24; G01R 27/2605
   See application file for complete search history.

(56) References Cited

U.S. PATENT DOCUMENTS

| | | | |
|---|---|---|---|
| 4,680,429 A | 7/1987 | Murdock et al. | |
| 6,392,542 B1 | 5/2002 | Stanley | |

(Continued)

FOREIGN PATENT DOCUMENTS

| | | |
|---|---|---|
| DE | 3782948 T2 | 4/1993 |
| DE | 112014001880 T5 | 12/2015 |

(Continued)

OTHER PUBLICATIONS

European Patent Office, International Search Report for International Application No. PCT/EP2019/052525, dated Apr. 4, 2019.

(Continued)

*Primary Examiner* — Paresh Patel
(74) *Attorney, Agent, or Firm* — Brooks Kushman P.C.

(57) ABSTRACT

A capacitive measuring system includes capacitive sensors and an evaluation circuit having a multiplexer, a synchronous rectifier, a sinusoidal signal generator, and a reference voltage divider. The capacitive sensors are acted on by a mono-frequency voltage signal generated by the sinusoidal signal generator, output signals of the capacitive sensors are transmitted in alternation to the synchronous rectifier via the multiplexer, and signal amplification of output signals of the synchronous rectifier are calibrated as a function of an activatable reference impedance. The synchronous rectifier is formed by a MOS semiconductor switch. A source-drain section of the MOS semiconductor switch forms a shunt that is controlled by the mono-frequency voltage signal. A channel of the multiplexer is provided for transmitting a calibration signal, generated by the reference voltage divider, to the synchronous rectifier alternately with the output signals of the capacitive sensors.

6 Claims, 3 Drawing Sheets

(56) References Cited

U.S. PATENT DOCUMENTS

| | | | |
|---|---|---|---|
| 9,726,775 B2 | 8/2017 | Lamesch | |
| 2001/0045733 A1 | 11/2001 | Stanley et al. | |
| 2006/0187038 A1 | 8/2006 | Shieh et al. | |
| 2015/0276790 A1* | 10/2015 | Yonezawa | G01P 15/0802 73/514.32 |
| 2016/0306061 A1 | 10/2016 | Lamesch | |

FOREIGN PATENT DOCUMENTS

| | | |
|---|---|---|
| WO | 03100462 A2 | 12/2003 |
| WO | 2009015404 A2 | 2/2009 |
| WO | 2010111668 A1 | 9/2010 |

OTHER PUBLICATIONS

German Patent and Trademark Office, German Search Report for German Patent Application No. DE 10 3545 060 884.4, dated May 22, 2018.

The International Bureau of WIPO, International Preliminary Report on Patentability for International Application No. PCT/EP2019/052525 dated Aug. 4, 2020.

\* cited by examiner

CAPACITIVE MEASURING SYSTEM

CROSS-REFERENCE TO RELATED APPLICATIONS

This application is a continuation of International Application No. PCT/EP2019/052525, published in German, with an International filing date of Feb. 1, 2019, which claims priority to DE 10 2018 000 884.4, filed Feb. 3, 2018; the disclosures of which are hereby incorporated in their entirety by reference herein.

TECHNICAL FIELD

The present invention relates to a capacitive measuring system having multiple capacitive sensors and an evaluation circuit including a multi-channel, analog multiplexer and a synchronous rectifier, wherein the capacitive sensors are acted on by a mono-frequency voltage signal, output signals of the capacitive sensors are connected in alternation to the synchronous rectifier via the multiplexer, and signal amplification of output signals of the synchronous rectifier may be calibrated as a function of an activatable reference impedance.

BACKGROUND

For determining capacitance values, capacitive measuring systems often use multi-frequency methods that employ a charge pump and an integrator. A conductive surface that forms a capacitor with ground is charged over multiple cycles, and the charges are stored in an integration capacitor. After a measuring cycle ends, the voltage is then evaluated via the integration capacitor.

It is difficult with such methods to measure large capacitances. In addition, there are limitations with regard to electromagnetic compatibility (EMC) when interference emissions and interference immunity are involved. This is true in particular for large sensor surfaces.

In this regard, mono-frequency methods in which signals may be evaluated on a frequency-selective basis have proven advantageous.

The present invention relates to a capacitive measuring system for determining small changes in capacitance on large reference capacitors, making use of a mono-frequency measuring signal. Such measuring systems may be used, for example, in motor vehicles for hands on/off detection on the steering wheel, for seat occupancy recognition, in capacitive pedals, occupancy recognition mats in the trunk, and for large surface switches in general.

DE 11 2014 001 880 T5 (counterpart of U.S. Pat. No. 9,726,775) discloses a generic capacitive measuring system having an antenna electrode and an evaluation circuit. The antenna electrode generates an alternating electric field as a reaction to an alternating voltage supplied to the antenna electrode. The evaluation circuit has a transimpedance amplifier which, by supplying a current to the antenna electrode, holds the alternating voltage equal to a reference alternating voltage on a reference voltage node and measures the current. The evaluation circuit further has a multiplexer and a microcontroller configured to control the multiplexer. The multiplexer switches the antenna electrode to a current input of the transimpedance amplifier and to the reference alternating voltage node in alternation. The multiplexer, the transimpedance amplifier, and a low pass filter in operative connection with the transimpedance amplifier, together form a synchronous rectifier system. The current input node of the transimpedance amplifier is alternating current-coupled to the reference voltage node by a protective capacitor.

A disadvantage of this capacitive measuring system is that the transimpedance amplifier and the multiplexer require the use of numerous active components that are significantly influenced by environmental conditions, in particular the ambient temperature.

Another disadvantage of this capacitive measuring system is that calibration cannot take place while the capacitive measuring system is in use. A steering wheel sensor system would require, for example, letting go of the steering wheel during a calibration operation.

SUMMARY

An object is a generic capacitive measuring system that combines high measuring sensitivity, and at the same time low sensitivity to external interfering influences, in particular temperature influences, and avoids the above-mentioned disadvantages.

An embodiment provides a capacitive measuring system including capacitive sensors and an evaluation circuit having a multi-channel, analog multiplexer and a synchronous rectifier. In operation, a mono-frequency voltage signal is supplied to the capacitive sensors. Output signals of the capacitive sensors are alternately linked to the synchronous rectifier by the multiplexer. The signal strength of output signals of the synchronous rectifier is calibratable according to an activatable reference impedance. The synchronous rectifier is formed by a MOS semiconductor switch. The source-drain section of the MOS semiconductor switch forms a shunt that is controlled by the mono-frequency voltage signal. At least one channel of the multiplexer is provided for transmitting a calibration or reference signal ("calibration signal"), generated by a reference voltage divider, to the synchronous rectifier alternately with the output signals of the capacitive sensors.

In carrying out at least one of the above and/or other objects, a capacitive measuring system is provided. The capacitive measuring system includes capacitive sensors and an evaluation circuit having a multiplexer, a synchronous rectifier, a sinusoidal signal generator, and a reference voltage divider. The capacitive sensors are acted on by a mono-frequency voltage signal generated by the sinusoidal signal generator, output signals of the capacitive sensors are transmitted in alternation to the synchronous rectifier via the multiplexer, and signal amplification of output signals of the synchronous rectifier are calibrated as a function of an activatable reference impedance. The synchronous rectifier is formed by a MOS semiconductor switch. A source-drain section of the MOS semiconductor switch forms a shunt that is controlled by the mono-frequency voltage signal. A channel of the multiplexer is provided for transmitting a calibration signal, generated by the reference voltage divider, to the synchronous rectifier alternately with the output signals of the capacitive sensors.

In embodiments, the synchronous rectifier is formed by a MOS semiconductor switch, the source-drain section of the MOS semiconductor switch forms a shunt that is controlled by the mono-frequency voltage signal, and at least one channel of the multiplexer is provided for transmitting a calibration signal, generated by a reference voltage divider, to the synchronous rectifier alternately with the output signals of the capacitive sensors.

Forming the synchronous rectifier by a MOS semiconductor switch, the source-drain section of which forms a controlled shunt, is advantageous due to the fact that no temperature-sensitive component is connected in the signal path. By switching on the source-drain section, a half-wave of the measuring signal is switched to ground and thereby cut off. In contrast, the remaining half-wave remains completely uninfluenced by the switched-off MOS semiconductor switch, so that the one-way rectification also is not influenced by the ambient temperature.

To achieve high sensitivity in the signal evaluation, the evaluation takes place based on a comparison (or comparative) voltage whose magnitude is influenced by at least one calibration signal. The at least one calibration signal is generated by a reference voltage divider exposed to the same environmental conditions as the remaining capacitive measuring system, so that the calibration signal represents these environmental conditions.

It is advantageous that the at least one calibration signal is routed via a channel of the multiplexer to the synchronous rectifier. As a result, the at least one calibration signal takes the same signal path as the output signals of the capacitive sensors which are also routed via the multiplexer to the synchronous rectifier. It is advantageous to provide two reference voltage dividers which respectively set respective first and second calibration signals for an upper comparison value and a lower comparison value.

It is also advantageous that the cyclical evaluation of the output signals of the capacitive sensors does not have to be interrupted for the calibration; instead, the calibration takes place regularly as part of the evaluation cycle, "intermittently" in a manner of speaking.

BRIEF DESCRIPTION OF THE DRAWINGS

Embodiments of the present invention are explained in greater detail below and illustrated with reference to the drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
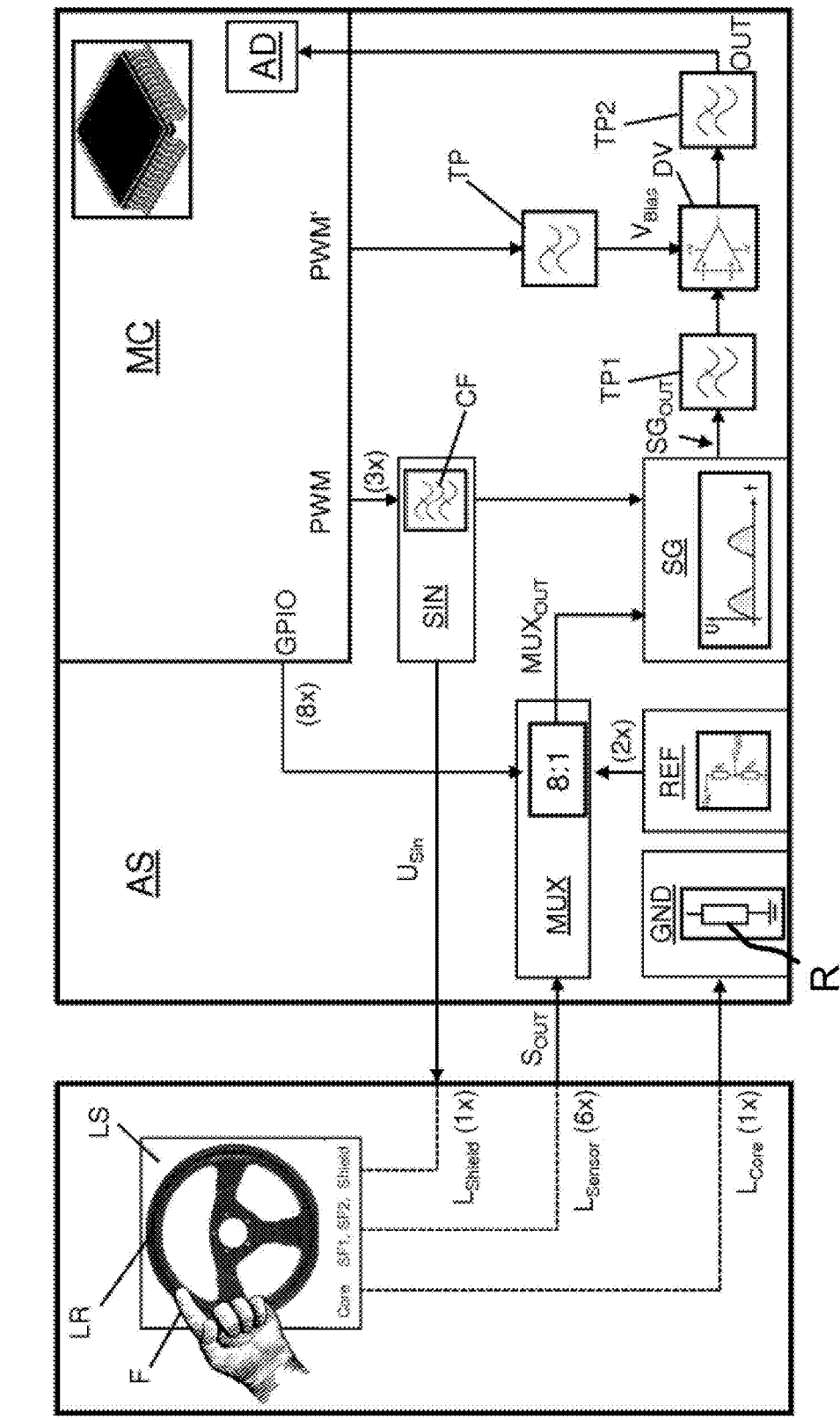
FIG. 1 illustrates a first block diagram of a capacitive measuring system having a steering wheel sensor system.

FIG. 1 illustrates a block diagram of the functional components of a capacitive measuring system. The capacitive measuring system includes multiple capacitive sensors. The capacitive sensors are situated on a steering wheel LR of a motor vehicle. The capacitive sensors together form a steering wheel sensor system LS for recognizing contact of steering wheel LR by a human hand, particularly, a finger F.

Figure 3:
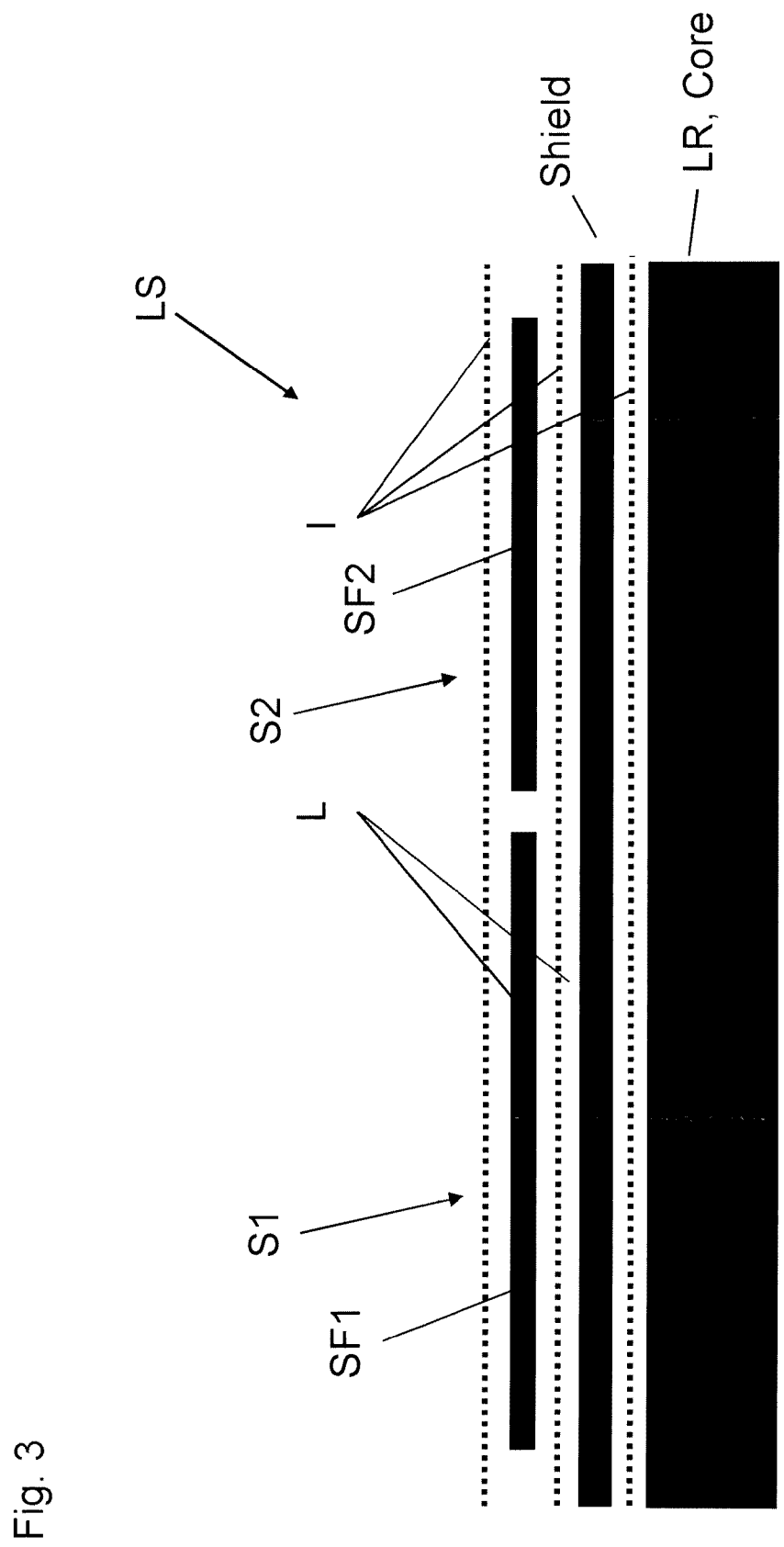
FIG. 3 illustrates a diagram of the structure of the steering wheel sensor system.

FIG. 3 illustrates a schematic of the structural principle of steering wheel sensor system LS. Steering wheel sensor system LS is made up of an arrangement of conductors L and insulators I layered in alternation. Conductors L and insulators I are situated on or around the steering wheel rim, and optionally also on or around the spokes of steering wheel LR. Conductors L are preferably made of copper foils or metal mesh. Insulators I are preferably made of plastic films. The conductive steering wheel core is labeled "Core" in FIG. 3. Situated above the steering wheel core, separated by an insulator I, is a shield conductor. The shield conductor is labeled "Shield" in FIG. 3.

The uppermost layer of conductors L is formed by multiple adjacently situated sensor foils SF1, SF2. Sensor foils SF1, SF2, in contrast to the other conductors L, are arranged not continuously, but, rather, in multiple separate adjacent sections on steering wheel LR. Sensor foils SF1, SF2 may have different shapes and sizes. The diagram illustrated in FIG. 3 shows in particular an arrangement of two capacitive sensors S1, S2. The number of capacitive sensors may be easily increased to an intended value by adding additional sensor foils.

Capacitive sensors S1, S2 divide the shield conductor. The shield conductor is intended to shield sensor foils SF1, SF2 from the grounded metal core of steering wheel LR. For this purpose, sensor foils SF1, SF2 overlap the shield conductor.

As shown in FIG. 1, the capacitive measuring system further includes an evaluation circuit AS. Evaluation circuit AS includes a micro-controller MC, a multi-channel analog multiplexer MUX, a synchronous rectifier SG, a sinusoidal signal generation device SIN, first and second reference voltage dividers REF, and a differential amplifier DV.

Strictly by way of example, steering wheel sensor system LS illustrated in FIG. 1 is designed with six capacitive sensors (not illustrated in detail in FIG. 1) situated on steering wheel LR. A total of six connecting lines $L_{Sensor}$ lead individually from the capacitive sensors on steering wheel LR to evaluation circuit AS. Connecting lines $L_{Sensor}$ are connected to sensor foils SF1, SF2. In addition, in each case there is a connecting line $L_{Shield}$ to the shield conductor and a connecting line $L_{Core}$ to the metal core of steering wheel LR. The number of connecting lines provided in each case is indicated in FIG. 1 by the information in parentheses ("6×", "1×", "1×", for example).

In evaluation circuit AS, connecting line $L_{Core}$ to the, metal core of steeling wheel LR is connected to the vehicle ground GND via a ground resistor R. Connecting line $L_{Shield}$ to the shield conductor is coupled to the output of sinusoidal signal generation device SIN of evaluation circuit AS. Connecting line $L_{Shield}$ to the shield conductor is used for coupling a mono-frequency sinusoidal signal $U_{sin}$ from sinusoidal signal generation device SIN into steering wheel sensor system LS.

The six sensor lines $L_{Sensor}$ are led in evaluation circuit AS to respective inputs of multiplexer MUX of evaluation circuit AS. Two further inputs of multiplexer MUX (illustrated here with eight channels) are occupied by the respective center connection of the reference voltage dividers REF of evaluation circuit AS.

Multiplexer MUX is controlled by microcontroller MC of evaluation circuit AS. A particularly simple and cost-efficient design of multiplexer MUX may be achieved in that multiplexer MUX is made up of a number of controllable analog switches that correspond to the intended number of channels. The analog switches of multiplexer MUX are in each case controlled in alternation in a clocked manner via a programmable universal connection GPIO (general purpose input-output) of microcontroller MC.

For EMC reasons, mono-frequency sinusoidal signal $U_{sin}$ having a frequency in the range of 100 kHz is used as a measuring signal for steering wheel sensor system LS situated on steering wheel LR. Three centered pulse width-modulated signals PWM, generated entirely by the hardware of microcontroller MC, are used to generate sinusoidal signal $U_{sin}$. Sinusoidal signal $U_{sin}$ results from forming these pulse width-modulated signals PWM using a Chebyshev filter CF. The signal generation is functionally illustrated here by a circuit block, referred to as sinusoidal signal generation device SIN.

Use is made of the attenuation of mono-frequency sinusoidal signal $U_{sin}$, when generating a detectable measuring signal by steering wheel sensor system LS. For this purpose, via connecting line $L_{Shield}$, sinusoidal signal $U_{sin}$ is applied to the shield conductor, which in each case forms a capacitive voltage divider with sensor foils SF1, SF2.

An attenuated sinusoidal signal having the same frequency and phase, but with a smaller amplitude, falls at the output of the respective capacitive voltage divider, i.e., at sensor foils SF1, SF2 (i.e., at the output of the respective capacitive voltage divider, i.e., at the sensor foils SF1, SF2, each have a damped sinusoidal signal with the same frequency and phase, but with a smaller amplitude). The capacitance values of capacitive sensors S1, S2 are influenced by the presence of a hand or a finger, as the result of which the amplitudes of sensor signals $S_{out}$ present at sensor foils SF1, SF2 change.

At the same time, sensor signals $S_{out}$ outputted from capacitance sensors S1, S2 (i.e., the output signals of capacitance sensors S1, S2) are present at the inputs of multiplexer MUX and, controlled by microcontroller MC, are transmitted in succession to the output of multiplexer MUX in alternation.

Each signal $MUX_{OUT}$ present at the output of multiplexer MUX is relayed to the input of synchronous rectifier SG. Synchronous rectifier SG is supplied with the mono-frequency sinusoidal signal $U_{sin}$ as a calibration signal. Synchronous rectifier SG rectifies, on a frequency-selective basis, output signals $MUX_{OUT}$ of multiplexer MUX having the same frequency as the mono-frequency sinusoidal signal $U_{sin}$, which is coupled into shield line $L_{Shield}$. This effectively suppresses interference signals having different frequencies.

The output signal $SG_{out}$ of synchronous rectifier SG is amplified by a differential amplifier DV of evaluation circuit AS. Differential amplifier DV is supplied with a comparison (or comparative) voltage $V_{Bias}$ for adapting the sensitivity. The output signal OUT of differential amplifier DV is filtered via a further low pass circuit TP2 and digitized by an analog-digital converter AD that is part of microcontroller MC, then evaluated and optionally used by microcontroller MC for controlling functions associated with the recognized signals.

Microcontroller MC computes the comparison voltage $V_{Bias}$ that is optimal in each case for adapting the sensitivity. To specify this comparison voltage for the differential amplifier DV, microcontroller MC influences the duty cycle of a pulse width-modulated signal PWM'. Pulse width-modulated signal PWM' is smoothed with respect to comparison voltage $V_{Bias}$ by a low pass circuit TP.

Comparison voltage $V_{Bias}$ is a function of at least one calibration or reference voltage signal that is generated by at least one reference voltage divider REF. The calibration voltage signal is affected by environmental influences of which the at least one reference voltage divider REF is exposed. If multiple reference voltage dividers REF, such as two in the present exemplary embodiment, are provided, then they may also specify multiple parameters such as a maximum value and a minimum value.

The calibration voltage signal, present at each center tap of a reference voltage divider REF, is supplied in each case to an input of multiplexer MUX. The calibration voltage signal thus passes through the same signal path as sensor signals $S_{out}$, and at the end is likewise digitized by analog-digital converter AD and evaluated by microcontroller MC. By adapting the output pulse width-modulated signal PWM', microcontroller MC may thus adapt comparison voltage $V_{Bias}$ to the instantaneously present calibration voltage values without having to interrupt the detection of the sensor signals at steering wheel LR.

Figure 2:
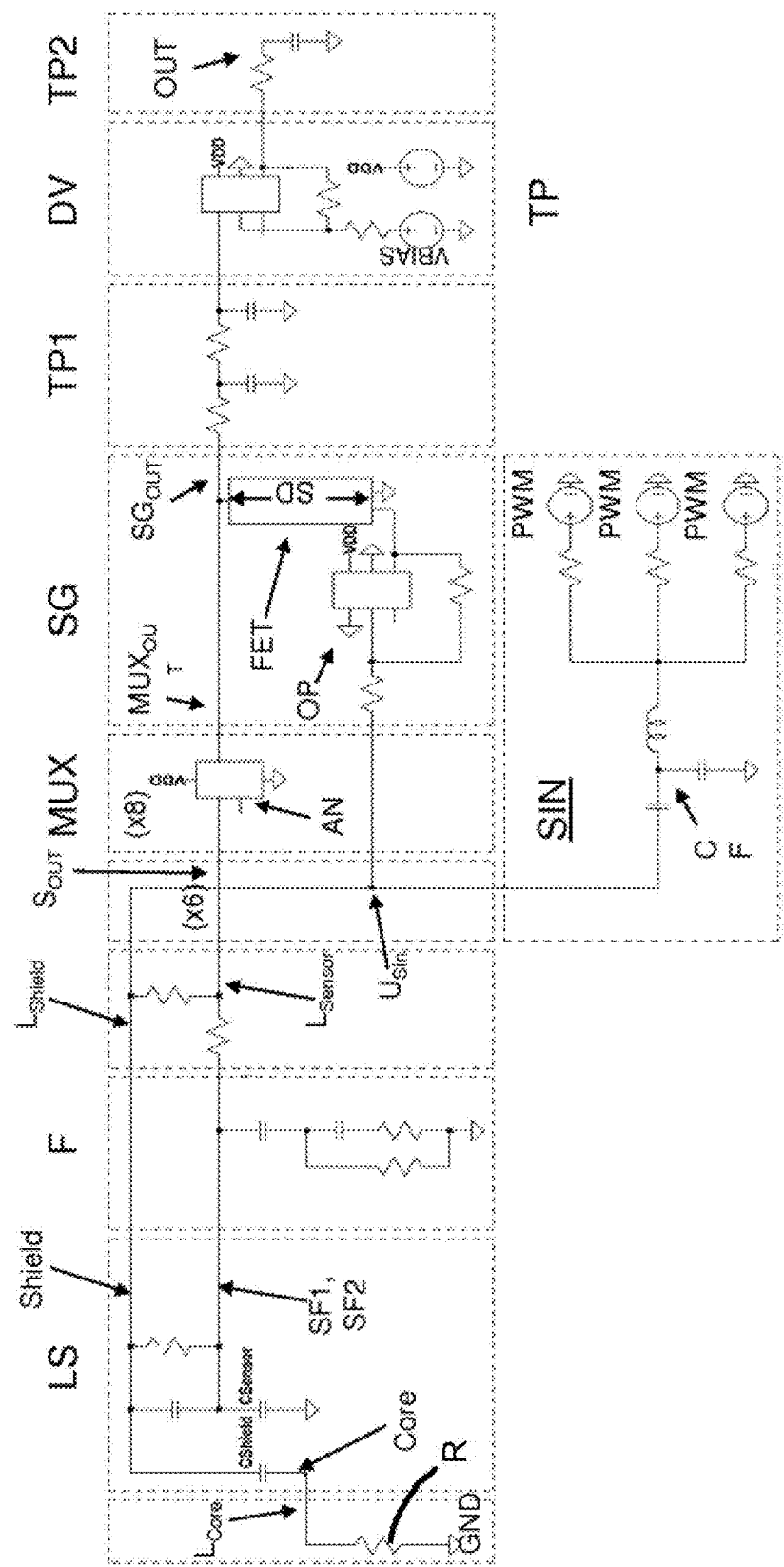
FIG. 2 illustrates a second block diagram of the capacitive measuring system.

Advantageous details of evaluation circuit AS are illustrated in FIG. 2, which shows several individual circuit details with regard to the arrangement of electronic components. Evaluation circuit AS is shown here also in a simplified, schematic illustration. In particular, for reasons of better clarity in FIG. 2 the illustration of microcontroller MC that carries out the control is omitted. Various function blocks are designated in accordance with the corresponding function blocks in FIG. 1. Since the basic operating principle has already been explained with reference to FIG. 1, the explanation of FIG. 2 is limited to a few special features.

The circuit block depicts capacitive steering wheel sensor system LS illustrated in FIG. 3 based on an equivalent circuit diagram, which in particular shows that steering wheel sensor system LS forms one or multiple capacitive voltage dividers (in the present case, only one of multiple sensor lines $L_{Sensor}$ is illustrated). In addition, human finger F is illustrated as an equivalent circuit diagram made up of capacitive and ohmic components that act electrically between one of sensor foils SF1, SF2 and the vehicle ground.

Sensor line $L_{Sensor}$ leads to the input of an analog switch AN of multiplexer MUX. Corresponding to the eight-channel design of multiplexer MUX by way of example here, multiplexer MUX contains eight individual analog switches AN, only one of which is depicted here. The inputs of six of these eight analog switches AN are occupied by sensor lines $L_{Sensor}$, and two further inputs are connected to the center connections of a respective reference voltage divider REF (illustrated in FIG. 1).

To allow grounded elements, such as hands or fingers on steering wheel LR, to be detected with good sensitivity in the vicinity of a capacitive sensor, the circuit is calibrated with regard to the environmental conditions (temperature, moisture, aging, etc.). For this purpose, reference voltage dividers REF, illustrated in FIG. 1, are used with known impedances. As indicated in FIG. 1, reference voltage dividers REF may have a simple design as ohmic voltage dividers, whose external connections are each connected to a fixed potential, for example to the poles of the supply voltage of evaluation circuit AS.

Analog switches AN of multiplexer MUX are switched on in succession by microcontroller MC in alternation so that its respective input signal reaches the output of multiplexer MUX, and thus, also the input of synchronous rectifier SG.

To obtain a direct voltage signal, output signal $MUX_{OUT}$ of multiplexer MUX is half-wave rectified with phase sensitivity via a switched shunt and is subsequently filtered by a low pass circuit TP1. The switched shunt is in the form of the source-drain section SD of a MOSFET semiconductor switch FET, which forms synchronous rectifier SG. The gate G of the MOSFET semiconductor switch FET is controlled by mono-frequency sinusoidal signal $U_{sin}$. Operational amplifier OP connected upstream from the gate G is used for level adjustment.

The difference between the filtered measuring signal and the comparison voltage $V_{Bias}$ is amplified in differential amplifier DV. The sensitivity of the circuit is calibrated using the difference between comparison voltage $V_{Bias}$ and the measuring signal. Adapting the sensitivity of differential amplifier DV allows use to be made of the entire input voltage range of analog-digital converter AD for determining a useful signal.

REFERENCE SYMBOLS

AD analog-digital converter
AN analog switch
AS evaluation circuit
Core core electrode
CF Chebyshev filter
DV differential amplifier
FET MOSFET semiconductor switch
G gate
GND vehicle ground
GPIOs universal connections (general purpose input-output)
I insulators, insulation (foil)
L conductor
LR steering wheel
LS steering wheel sensor system (capacitive sensors)
$L_{Core}$ connecting line or cable (core line or cable)
$L_{Sensor}$ connecting lines or cables (sensor line(s) or cable(s))
$L_{Shield}$ connecting line or cable (shield line or cable)
MC microcontroller
MUX analog multiplexer
$MUX_{OUT}$ output signals of the multiplexer
OP operational amplifier
PWM, PWM' pulse width-modulated signal
R ground resistor
REF reference voltage divider
S1, S2 capacitive sensors
SD source-drain section
SF1, SF2 sensor foils
SG synchronous rectifier
$SG_{out}$ output signals of the synchronous rectifier
SIN sinusoidal signal generation device
Shield shield conductor or electrode
$S_{out}$ output signals of the capacitive sensors (sensor signals)
TP, TP1, TP2 low pass circuit
$U_{sin}$ mono-frequency sinusoidal signal
$V_{Bias}$ comparison or comparative voltage
OUT output signal of the differential amplifier While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A capacitive measuring system comprising:
a plurality of capacitive sensors;
an evaluation circuit having a multiplexer, a synchronous rectifier, a sinusoidal signal generator, and a reference voltage divider;
wherein the capacitive sensors are acted on by a mono-frequency voltage signal generated by the sinusoidal signal generator, output signals of the capacitive sensors are transmitted in alternation to the synchronous rectifier via the multiplexer, and signal amplification of output signals of the synchronous rectifier are calibrated as a function of an activatable reference impedance; and
the synchronous rectifier is limited by a MOS semiconductor switch, a source-drain section of the MOS semiconductor switch forms a shunt that is controlled by the mono-frequency voltage signal, and a channel of the multiplexer is provided for transmitting a calibration signal, generated by the reference voltage divider, to the synchronous rectifier alternately with the output signals of the capacitive sensors.

2. The capacitive measuring system of claim 1 wherein:
the evaluation circuit includes another reference voltage divider;
another channel of the multiplexer is provided for transmitting a different calibration signal, generated by the another reference voltage divider, to the synchronous rectifier alternately with the output signals of the capacitive sensors; and
wherein one of the calibration signals corresponds to an upper limit and the other one of the calibration signals corresponds to a lower limit.

3. The capacitive measuring system of claim 1 wherein:
the evaluation circuit further includes a microcontroller; and
the sinusoidal signal generator generates the mono-frequency voltage signal using a Chebyshev filter and three centered pulse width-modulated voltages generated by the microcontroller.

4. The capacitive measuring system of claim 1 wherein:
the capacitive measuring: system is provided for hands on/off detection on a steering wheel of a vehicle.

5. The capacitive measuring system of claim 1 wherein:
the evaluation circuit further includes a microcontroller; and
the microcontroller evaluates the output signals of the synchronous rectifier based a comparison voltage that depends on the calibration signal.

6. The capacitive measuring system of claim 1 wherein:
a gate of the MOS semiconductor switch is controlled by the mono-frequency voltage signal forte shunt to be controlled by the mono-frequency voltage signal.

* * * * *

UNITED STATES PATENT AND TRADEMARK OFFICE
CERTIFICATE OF CORRECTION

| | |
|---|---|
| PATENT NO. | : 11,920,960 B2 |
| APPLICATION NO. | : 16/983330 |
| DATED | : March 5, 2024 |
| INVENTOR(S) | : Torben Zeleny et al. |

It is certified that error appears in the above-identified patent and that said Letters Patent is hereby corrected as shown below:

On the Title Page

After "Related U.S. Application Data
(63) Continuation of application No. PCT/EP2019/052525, filed on Feb. 1, 2019.":
Insert -- (30) Foreign Application Priority Data
Feb 3, 2018 (DE) 10 2018 000 884.4 --.

In the Claims

Column 8, Line 55, Claim 6:
After "mono-frequency voltage signal"
Delete "forte" and
Insert -- for the --.

Signed and Sealed this
First Day of October, 2024

Katherine Kelly Vidal
*Director of the United States Patent and Trademark Office*